(12) United States Patent
Saita et al.

(10) Patent No.: US 10,699,844 B1
(45) Date of Patent: Jun. 30, 2020

(54) THIN FILM CAPACITOR AND MULTILAYER CIRCUIT BOARD HAVING THE THIN FILM CAPACITOR EMBEDDED THEREIN

(71) Applicant: TDK CORPORATION, Tokyo (JP)

(72) Inventors: Hitoshi Saita, Tokyo (JP); Kazuhiro Yoshikawa, Tokyo (JP); Yuuki Aburakawa, Tokyo (JP); Tatsuo Namikawa, Tsuruoka (JP); Akiyasu Iioka, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/735,386

(22) Filed: Jan. 6, 2020

(30) Foreign Application Priority Data

Jan. 31, 2019 (JP) .................. 2019-016011

(51) Int. Cl.
| | | |
|---|---|---|
| *H01G 4/33* | (2006.01) | |
| *H05K 1/02* | (2006.01) | |
| *H01G 4/012* | (2006.01) | |
| *H05K 1/16* | (2006.01) | |
| *H01L 23/58* | (2006.01) | |
| *H01L 23/498* | (2006.01) | |

(52) U.S. Cl.
CPC .............. *H01G 4/012* (2013.01); *H01G 4/33* (2013.01); *H01L 23/49822* (2013.01); *H01L 23/58* (2013.01); *H05K 1/162* (2013.01)

(58) Field of Classification Search
CPC .......... H01G 4/33; H01G 2/24; H05K 1/0266; H05K 1/0268; H05K 1/0269; H01L 23/544

See application file for complete search history.

(56) References Cited

FOREIGN PATENT DOCUMENTS

JP 2014003167 A 1/2014

*Primary Examiner* — Jeremy C Norris
(74) *Attorney, Agent, or Firm* — Young Law Firm, P.C.

(57) ABSTRACT

Disclosed herein is a thin film capacitor that includes a lower electrode layer, an upper electrode layer, and a dielectric layer positioned between the lower electrode layer and the upper electrode layer. The upper electrode layer has a first capacitive electrode part opposed to the lower electrode layer through the dielectric layer without being connected to the lower electrode layer and a fiducial mark part penetrating the dielectric layer to be connected to the lower electrode layer.

5 Claims, 6 Drawing Sheets

THIN FILM CAPACITOR AND MULTILAYER CIRCUIT BOARD HAVING THE THIN FILM CAPACITOR EMBEDDED THEREIN

BACKGROUND OF THE INVENTION

Field of the Invention

The present invention relates to a thin film capacitor and a multilayer circuit board having the thin film capacitor embedded therein and, more particularly, to a thin film capacitor having a fiducial mark and a multilayer circuit board having the thin film capacitor embedded therein.

Description of Related Art

Generally, a circuit board on which an IC is mounted has a decoupling capacitor mounted thereon so as to stabilize the potential of a power supply to be supplied to the IC. As the decoupling capacitor, a multilayer ceramic chip capacitor is commonly used, and a required decoupling capacitance is ensured by mounting a large number of the multilayer ceramic chip capacitors on the surface of a circuit board.

However, in recent years, a space on the circuit board for mounting a large number of the multilayer ceramic chip capacitors may become insufficient. Sometimes, a thin film capacitor capable of being embedded in the circuit board is therefore used in place of the multilayer ceramic chip capacitor (JP 2014-3167 A).

A thin film capacitor described in JP 2014-3167 A has a measurement electrode for connection of a probe in a screening test before shipment.

However, in JP 2014-3167 A, a process for forming the measurement electrode is required, so that the number of manufacturing processes disadvantageously increases.

SUMMARY

It is therefore an object of the present invention to provide a thin film capacitor for which it is not necessary to provide a dedicated measurement electrode for connection of a probe and a multilayer circuit board having the thin film capacitor embedded therein.

A thin film capacitor according to the present invention includes a lower electrode layer, an upper electrode layer, and a dielectric layer positioned between the lower electrode layer and the upper electrode layer. The upper electrode layer has a first capacitive electrode part opposed to the lower electrode layer through the dielectric layer without being connected to the lower electrode layer and a fiducial mark part penetrating the dielectric layer to be connected to the lower electrode layer.

According to the present invention, the fiducial mark part for use in alignment at the time of mounting is connected to the lower electrode layer, so that it is possible to perform a screening test before shipment by connecting a probe to the fiducial mark part. This eliminates the need to provide a dedicated measurement electrode, thus preventing the number of manufacturing processes for the thin film capacitor from increasing.

In the present invention, the upper electrode layer may have a keep-out area positioned at the outer peripheral portion thereof and an effective area surrounded by the keep-out area, and at least a part of the fiducial mark part may be positioned in the keep-out area. This allows effective use of the keep-out area in which connection to a via conductor is inhibited when the thin film capacitor is embedded in a multilayer circuit board.

In this case, the upper electrode layer may further have a second capacitive electrode part disposed in the effective area and penetrating the dielectric layer to be connected to the lower electrode layer, and a probe mark may exist in the fiducial mark part and may not exist in the second capacitive electrode part. This prevents the second capacitive electrode part from being damaged by probing, making it possible to enhance reliability.

A multilayer circuit board according to the present invention is a multilayer circuit board having the above-described thin film capacitor embedded therein and includes a first via conductor connected to the first capacitive electrode part and a second via conductor connected to the second capacitive electrode part.

According to the present invention, the via conductor can be connected to a part where the probe mark does not exist, making it possible to enhance reliability. In this case, the fiducial mark part may be wholly covered with an interlayer insulating film without being connected to any via conductor.

Thus, according to the present invention, there can be provided a thin film capacitor for which it is not necessary to provide a dedicated measurement electrode for connection of a probe and a multilayer circuit board having the thin film capacitor embedded therein.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1A:
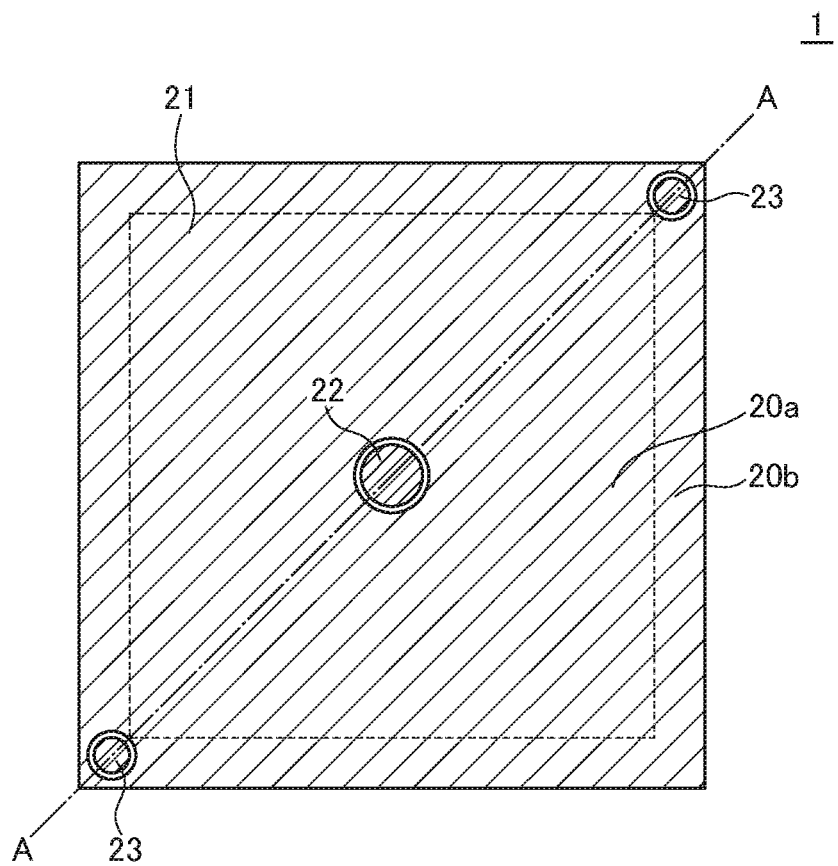
FIG. 1A is a schematic plan view for explaining the structure of a thin film capacitor according to a preferred embodiment of the present invention.
Figure 1B:
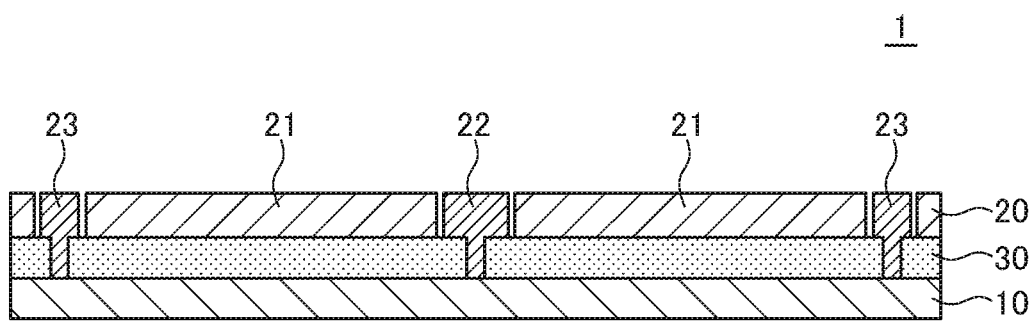
FIG. 1B is a schematic cross-sectional view taken along line A-A in FIG. 1A.

FIG. 1A is a schematic plan view for explaining the structure of a thin film capacitor 1 according to a preferred embodiment of the present invention. FIG. 1B is a schematic cross-sectional view taken along line A-A in FIG. 1A.

As illustrated in FIGS. 1A and 1B, the thin film capacitor 1 according to the present embodiment has a lower electrode layer 10, an upper electrode layer 20, and a dielectric layer 30 positioned between the lower electrode layer 10 and the upper electrode layer 20. The lower electrode layer 10 serves as a base for the thin film capacitor 1 and is made of, e.g., nickel (Ni). The upper electrode layer 20 is made of a laminated film of, e.g., nickel (Ni) and copper (Cu). The dielectric layer 30 is made of a ceramic material having a perovskite structure, such as barium titanate.

The upper electrode layer 20 is patterned to be divided into a first capacitive electrode part 21, a second capacitive electrode part 22, and a fiducial mark part 23. The second capacitive electrode part 22 and fiducial mark part 23 have a circular planar shape. The first capacitive electrode part 21 is opposed to the lower electrode layer 10 through the dielectric layer 30 without being connected to the lower electrode layer 10. Thus, the lower electrode layer 10 and first capacitive electrode part 21 constitute a pair of capacitor electrodes. The second capacitive electrode part 22 penetrates the dielectric layer 30 to be connected to the lower electrode layer 10. Thus, the second capacitive electrode part 22 has the same potential as the lower electrode layer 10. The fiducial mark part 23 is a mark for use in alignment at the time of mounting and penetrates the dielectric layer 30 to be connected to the lower electrode layer 10 like the second capacitive electrode part 22. Thus, the fiducial mark part 23 also has the same potential as the lower electrode layer 10.

As illustrated in FIG. 1A, the upper electrode layer has a keep-out area 20b positioned at the outer peripheral portion thereof and an effective area 20a surrounded by the keep-out area 20b. The keep-out area 20b is an area in which connection to a via conductor is inhibited when the thin film capacitor 1 is embedded in a multilayer circuit board. Thus, the via conductor of the multilayer circuit board is connected to the effective area 20a. In the present embodiment, a large part of the first capacitive electrode part 21 and the entire second capacitive electrode part 22 are positioned in the effective area 20a, and the entire fiducial mark part 23 is positioned in the keep-out area 20b.

Figure 2:
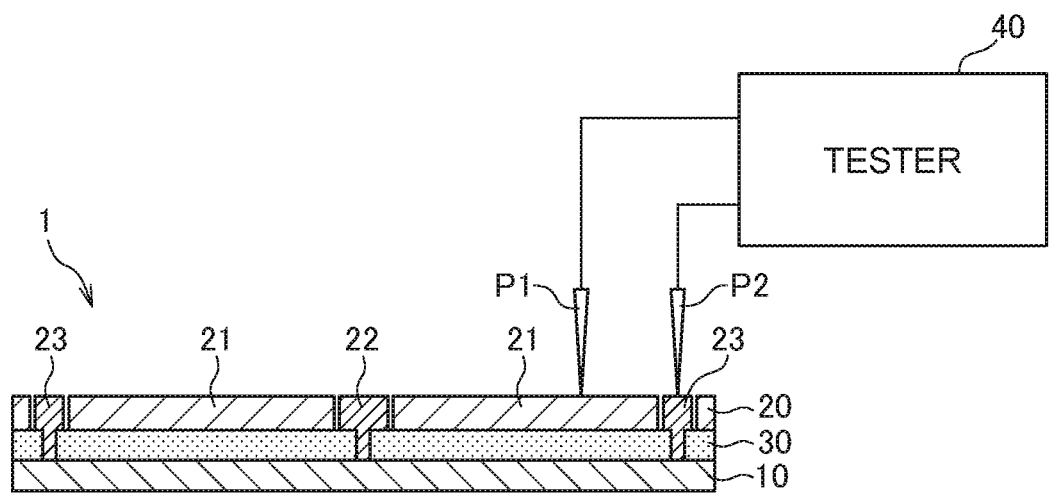
FIG. 2 is a schematic view for explaining a screening test before shipment of the thin film capacitor shown in FIG. 1.

FIG. 2 is a schematic view for explaining a screening test before shipment of the thin film capacitor 1.

As illustrated in FIG. 2, in the screening test before shipment of the thin film capacitor 1, the first capacitive electrode part 21 is probed with a probe P1 of a tester 40, and the fiducial mark part 23 is probed with a probe P2 of the tester 40. The tester 40 is an LCR meter or an insulation resistance meter and is used to test whether the first capacitive electrode part 21 of the upper electrode layer 20 and the lower electrode layer 10 are insulated properly from each other. As stated above, the fiducial mark part 23 is connected to the lower electrode layer 10, and therefore can make a determination whether the first capacitive electrode part 21 of the upper electrode layer 20 and the lower electrode layer 10 are insulated properly from each other, by probing the first capacitive electrode part 21 with the probe P1 and the fiducial mark part 23 with the probe P2.

Figure 3:
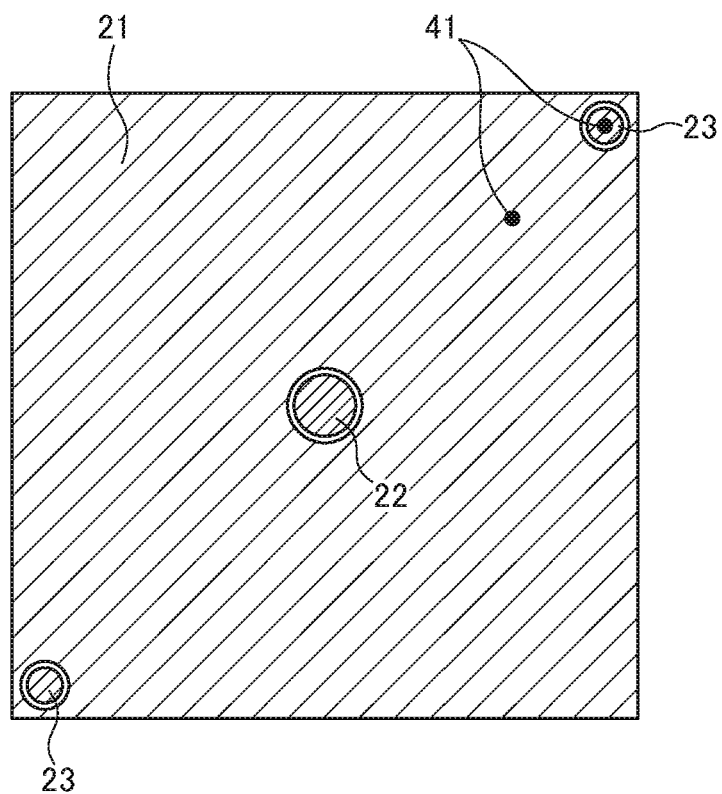
FIG. 3 is a schematic plan view indicating a position of a probe mark formed by a probing.

As described above, in the thin film capacitor 1 according to the present embodiment, the fiducial mark part 23 for use in alignment at the time of mounting is connected to the lower electrode layer 10, so that it is possible to perform the screening test from the upper surface side of the thin film capacitor 1 without providing a dedicated measurement electrode. After performing the screening test, a probe mark 41 is formed on the first capacitive electrode part 21 and fiducial mark part 23, as illustrated in FIG. 3.

The above screening test can be executed by probing the first and second capacitive electrode parts 21 and 22 with the probes P1 and P2, respectively. However, the second capacitive electrode part 22 is smaller in area than the first capacitive electrode part 21, so that when the probe mark is formed on the second capacitive electrode part 22, it is difficult to dispose the via conductor so as to avoid the probe mark. On the other hand, when not the second capacitive electrode part 22, but the fiducial mark part 23 is probed with the probe P2, the probe mark is not formed on the second capacitive electrode part 22, eliminating the need to connect the via conductor to the surface having the probe mark.

Figure 4:
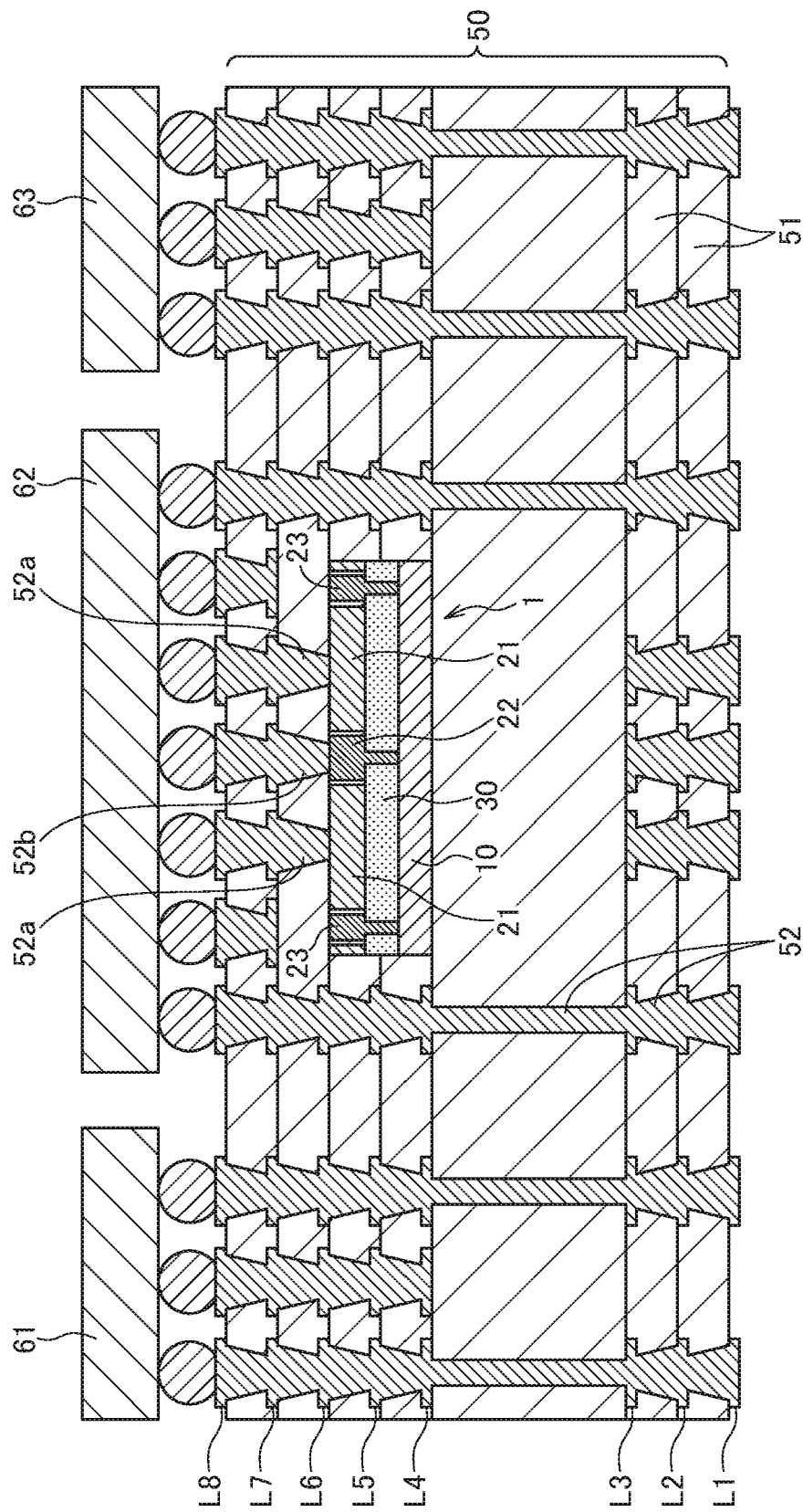
FIG. 4 is a schematic cross-sectional view for explaining the structure of a multilayer circuit board having the thin film capacitor shown in FIG. 1 embedded therein.

FIG. 4 is a schematic cross-sectional view for explaining the structure of a multilayer circuit board 50 having the thin film capacitor 1 according to the present embodiment embedded therein.

In the example illustrated in FIG. 4, the multilayer circuit board 50 has wiring layers L1 to L8, and an interlayer insulating film 51 is provided between adjacent wiring layers. The different wiring layers are connected to each other through via conductors 52. The wiring layer L8, which is the topmost layer, has a plurality of IC chips 61 to 63 mounted thereon. The thin film capacitor 1 is embedded in the thus configured multilayer circuit board 50, then a via conductor 52a applied with, e.g., a power supply potential is connected to the first capacitive electrode part 21, and a via conductor 52b applied with a ground potential is connected to the second capacitive electrode part 22, whereby the thin film capacitor 1 functions as a decoupling capacitor. The thin film capacitor 1 according to the present embodiment has no probe mark on the second capacitive electrode part 22 as described above, thereby allowing the via conductor 52b to be connected to the surface of the thin film capacitor 1 where the probe mark does not exist. The first capacitive electrode part 21 has the probe mark thereon; however, it has a large area, so that it is easy to connect the via conductor 52a to the first capacitive electrode part 21 so as to avoid the probe mark. The fiducial mark part 23 is wholly covered with the interlayer insulating film 51 without being connected to the via conductor 52.

Figure 5A:
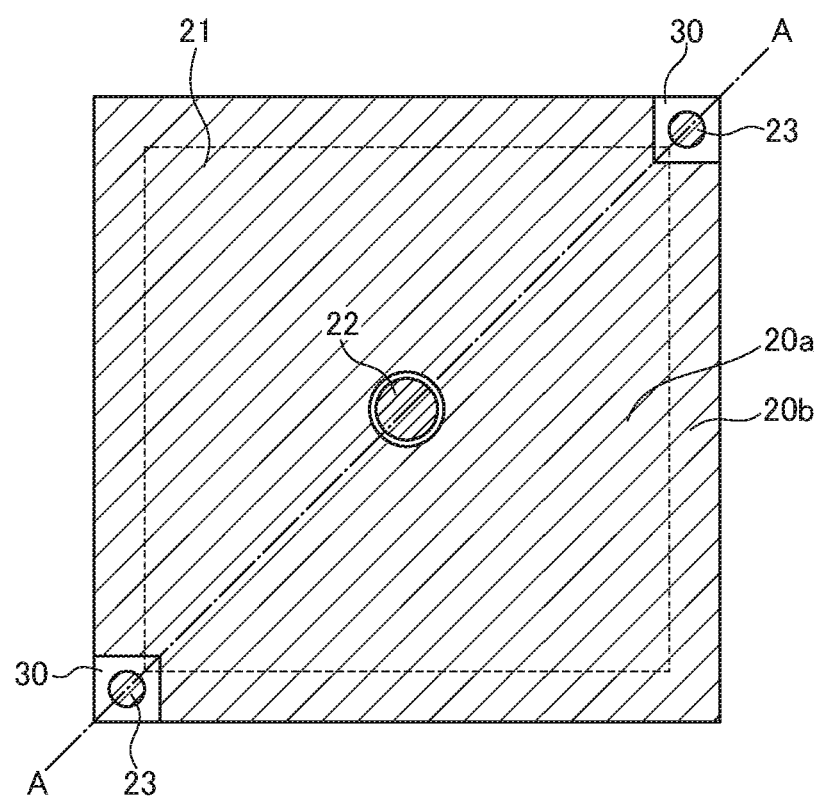
FIG. 5A is a schematic plan view for explaining the structure of a thin film capacitor according to a first modification.
Figure 5B:
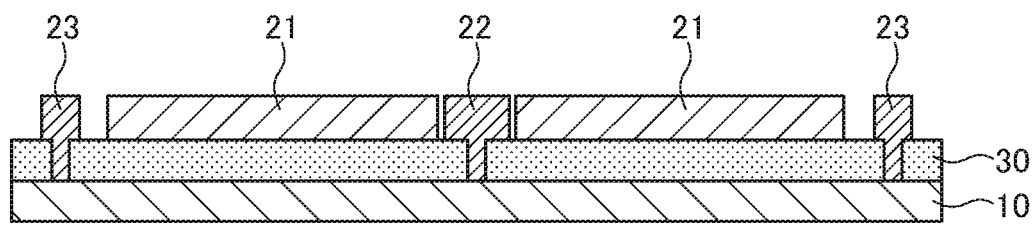
FIG. 5B is a schematic cross-sectional view taken along line A-A in FIG. 5A.

FIG. 5A is a schematic plan view for explaining the structure of a thin film capacitor 2 according to a first modification. FIG. 5B is a schematic cross-sectional view taken along line A-A in FIG. 5A. In the example of FIGS. 5A and 5B, a part of the first capacitive electrode part 21 around the fiducial mark part 23 is cut in a square shape. Thus, the cut positioned around the fiducial mark part 23 need not have the same shape as that of the fiducial mark part 23.

Figure 6A:
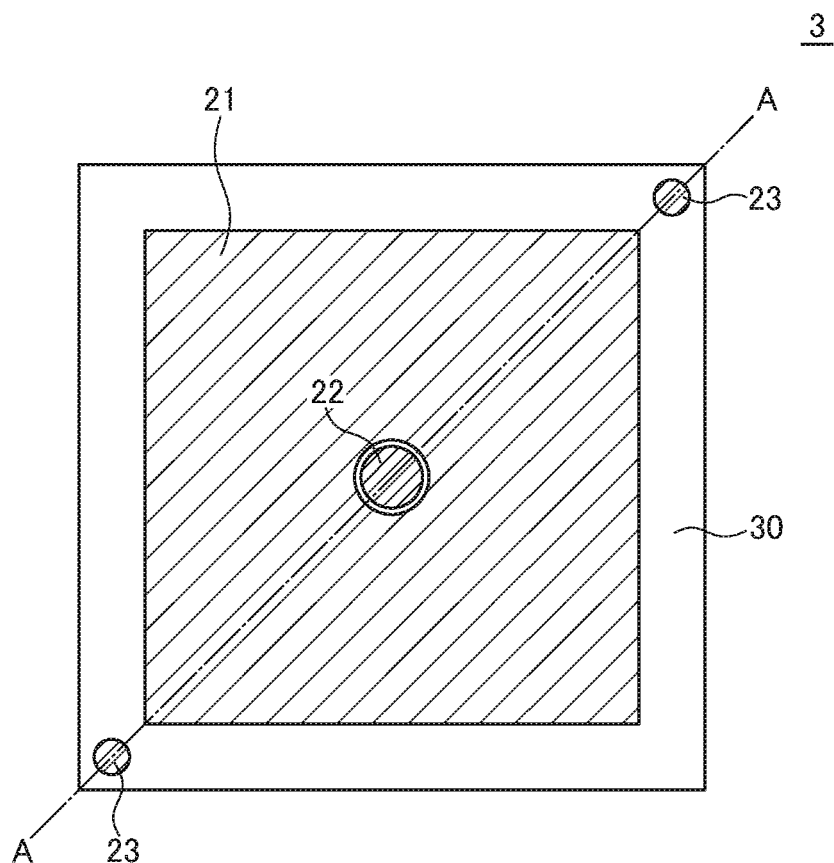
FIG. 6A is a schematic plan view for explaining the structure of a thin film capacitor according to a second modification.
Figure 6B:
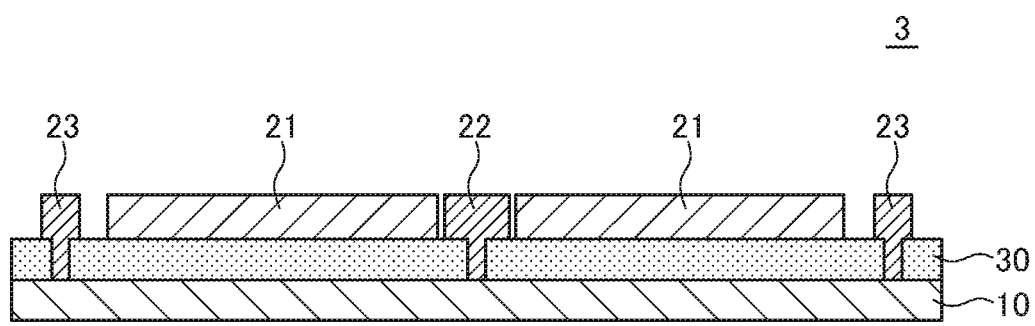
FIG. 6B is a schematic cross-sectional view taken along line A-A in FIG. 6A.

FIG. 6A is a schematic plan view for explaining the structure of a thin film capacitor 3 according to a second modification. FIG. 6B is a schematic cross-sectional view taken along line A-A in FIG. 6A. In the example of FIGS. 6A and 6B, the upper electrode layer 20 positioned in the keep-out area 20b is wholly removed excluding the fiducial mark part 23. Thus, the first capacitive electrode part 21 need not exist in the keep-out area 20b.

Figure 7A:
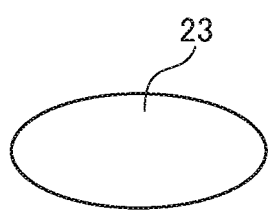
FIGS. 7A to 7F are views illustrating some variations of the planar shape of the fiducial mark part.
Figure 7B:
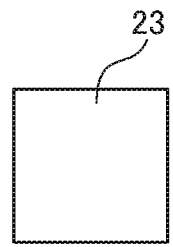
Figure 7C:
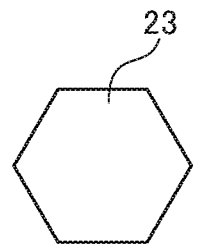
Figure 7D:
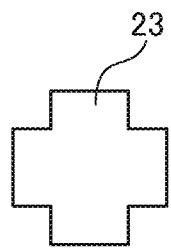
Figure 7E:
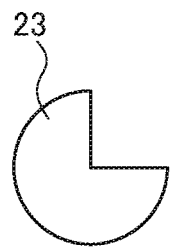
Figure 7F:
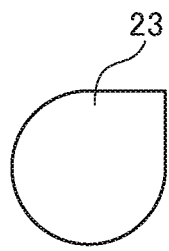

FIGS. 7A to 7F are views illustrating some variations of the planar shape of the fiducial mark part 23. The planar shape of the fiducial mark part 23 can be an ellipse (FIG. 7A), a quadrangle (FIG. 7B), a hexagon (FIG. 7C), a cross (FIG. 7D), a circle having a cut (FIG. 7E), or a shape obtained by combining a circle and a quadrangle (FIG. 7F). Thus, there is no particular restriction on the planar shape of the fiducial mark part 23.

It is apparent that the present invention is not limited to the above embodiments, but may be modified and changed without departing from the scope and spirit of the invention.

For example, the fiducial mark part 23 is disposed in the keep-out area 20*b* in the above embodiment; however, this is not essential in the present invention, and a part of or the entire fiducial mark part 23 may be disposed in the effective area 20*a*.

What is claimed is:

1. A thin film capacitor comprising:
    a lower electrode layer;
    an upper electrode layer; and
    a dielectric layer positioned between the lower electrode layer and the upper electrode layer,
    wherein the upper electrode layer has a first capacitive electrode part opposed to the lower electrode layer through the dielectric layer without being connected to the lower electrode layer and a fiducial mark part penetrating the dielectric layer to be connected to the lower electrode layer.

2. The thin film capacitor as claimed in claim 1,
    wherein the upper electrode layer has a keep-out area positioned at an outer peripheral portion thereof and an effective area surrounded by the keep-out area, and
    wherein at least a part of the fiducial mark part is positioned in the keep-out area.

3. The thin film capacitor as claimed in claim 2,
    wherein the upper electrode layer further has a second capacitive electrode part disposed in the effective area and penetrating the dielectric layer to be connected to the lower electrode layer, and
    wherein a probe mark exists in the fiducial mark part and does not exist in the second capacitive electrode part.

4. A multilayer circuit board having a thin film capacitor embedded therein,
    wherein the thin film capacitor comprising:
        a lower electrode layer;
        an upper electrode layer; and
        a dielectric layer positioned between the lower electrode layer and the upper electrode layer,
    wherein the upper electrode layer has a first capacitive electrode part opposed to the lower electrode layer through the dielectric layer without being connected to the lower electrode layer and a fiducial mark part penetrating the dielectric layer to be connected to the lower electrode layer,
    wherein the upper electrode layer has a keep-out area positioned at an outer peripheral portion thereof and an effective area surrounded by the keep-out area,
    wherein at least a part of the fiducial mark part is positioned in the keep-out area,
    wherein the upper electrode layer further has a second capacitive electrode part disposed in the effective area and penetrating the dielectric layer to be connected to the lower electrode layer,
    wherein a probe mark exists in the fiducial mark part and does not exist in the second capacitive electrode part, and
    wherein the multilayer circuit board includes a first via conductor connected to the first capacitive electrode part and a second via conductor connected to the second capacitive electrode part.

5. The multilayer circuit board as claimed in claim 4, wherein the fiducial mark part is wholly covered with an interlayer insulating film without being connected to any via conductor.

* * * * *